United States Patent [19]

Ando

[11] Patent Number: 5,119,165
[45] Date of Patent: Jun. 2, 1992

[54] SEMICONDUCTOR INTEGRATED CIRCUIT DEVICE USING A PLANAR STRUCTURE WITH REDUCED BIT LINE AND WORD LINE RESISTANCE

[75] Inventor: Yuichi Ando, Takarazuka, Japan

[73] Assignee: Ricoh Company, Ltd., Tokyo, Japan

[21] Appl. No.: 726,155

[22] Filed: Jul. 3, 1991

Related U.S. Application Data

[63] Continuation of Ser. No. 500,079, Mar. 27, 1990, abandoned.

[30] Foreign Application Priority Data

Apr. 6, 1989 [JP] Japan ................................. 1-89369

[51] Int. Cl.⁵ ................ H01L 29/04; H01L 27/10; H01L 23/48; H01L 27/02
[52] U.S. Cl. ........................................ 357/59; 357/45; 357/71; 357/41; 357/67
[58] Field of Search ............... 357/42, 59, 71, 67, 357/41, 45, 63

[56] References Cited

U.S. PATENT DOCUMENTS

| | | | |
|---|---|---|---|
| 4,141,022 | 2/1979 | Sigg et al. | 357/71 |
| 4,329,706 | 5/1982 | Crowder et al. | 357/59 |
| 4,356,622 | 11/1982 | Widmann | 357/59 |
| 4,558,507 | 12/1985 | Okabayashi et al. | 357/59 |
| 4,569,122 | 2/1986 | Chan | 357/59 |
| 4,593,302 | 6/1986 | Lidow et al. | 357/59 |
| 4,700,215 | 10/1987 | McPherson | 357/59 |
| 4,725,747 | 2/1988 | Stein et al. | 357/59 |
| 4,753,709 | 6/1988 | Welch et al. | 357/59 |
| 4,764,481 | 8/1988 | Alvi et al. | 357/71 |

*Primary Examiner*—Mark Prenty
*Attorney, Agent, or Firm*—Cooper & Dunham

[57] ABSTRACT

A semiconductor integrated circuit device which comprises a substrate, a first continuous longitudinal diffusion layer formed in the substrate and a second continuous longitudinal diffusion layer constitutes source areas of a plurality of MOS transistors. The second diffusion layer constitutes drain areas of the transistors. The device further comprises a first polycide layer formed on and along each of the first and second diffusion layers in contact therewith and a second polycide layer for constituting a gate electrode of each of the transistors. The second polycide layer is formed on and transversing the first polycide layers in a direction perpendicular to the first and second diffusion layers. An insulation layer is interposed between the first and second polycide layers.

4 Claims, 3 Drawing Sheets

SEMICONDUCTOR INTEGRATED CIRCUIT DEVICE USING A PLANAR STRUCTURE WITH REDUCED BIT LINE AND WORD LINE RESISTANCE

This is a continuation of application Ser. No. 500,079, filed Mar. 27, 1990 and now abandoned.

BACKGROUND OF THE INVENTION

1. Field of the Invention

The present invention relates to a semiconductor integrated circuit device such as a CMOS (complementary metal oxide semiconductor device) and an NMOS (N-type channel metal oxide semiconductor device). More particularly, the invention relates to a semiconductor integrated circuit which is useful as to a memory device.

2. Description of the Related Art

A MOS type integrated circuit device is fabricated in such a way that an element is separated by a field oxide film and that the source area and the drain area of the substrate are doped with impurities using the gate electrode as a mask by a self-alignment method.

However, one or two contacts have to be prepared for the source area and the drain area for one transistor device, which makes it difficult to realize a high density integrated circuit device due to the contact margin and the wiring space.

To cope with that problem, it has been proposed to use a semiconductor integrated circuit having a planar cell structure (Japanese Patent Applications Laying Open (KOKAI) Nos. 61-288464 and 63-96953).

In a planar cell structure, a continuous diffusion layer for source areas of a plurality of MOS transistors and a continuous diffusion layer for drain areas of the transistors are formed in parallel to each other in a substrate. On the substrate is formed a gate electrode which intersects the two diffusion layers through an insulation film.

In accordance with such a structure of the planar cell, it becomes unnecessary to form the field oxide film for separation of the element and besides the source areas and the drain areas of the common transistors can be used so that only one contact is required for several or tens of transistors, which makes it possible to realize a high density integrated circuit device.

However, in accordance with the planar cell structure, resistance of a diffusion layer is large since the layer is long, which lowers the function speed of the device since the bit line of the device is constituted from the diffusion layer.

When the memory cell is to be made more minute, a shallower junction is required. However, the planar cell structure does not allow using an LDD structure as the general transistors.

Also, if core ions are implanted into the device when the device is used as a mask ROM, the ions are also implanted to the long diffusion layer, which increases the junction capacitance and lowers the function speed of the device.

SUMMARY OF THE INVENTION

It is therefore an object of the present invention to provide a semiconductor integrated circuit device which makes it possible to utilize a advantageous points of the planar cell structure while avoiding the above-mentioned problems.

The above-mentioned object of the present invention can be achieved by a semiconductor integrated circuit device comprising a first continuous shallow diffusion layer for source areas of a plurality of MOS transistors formed on a substrate, a second continuous shallow layer for drain areas of the transistors formed on the substrate in parallel with the first diffusion layer, a first polycide layer formed on the substrate in contact with the first and second diffusion layers, and a second polycide layer constituting a gate electrode which is arranged in a dirrection intersecting the first and second diffusion layers and insulated from the first and second diffusion layers and the first polycide layer formed on the diffusion layers.

A first polycide layer which is composed of a plurality of films is disposed on the long diffusion layer, which reduces the resistance of the bit line and the common source.

A polycide layer is formed on each of the diffusion layers of the source area and the drain area. Impurities such as phosphorus or arsenic are diffused from the polycide layer, which makes it possible to form a shallow diffusion layer without aluminium spikes.

The polycide layers and an oxide film are disposed on the diffusion layer at the time of implanting the core material into the mask ROM. As a result, it becomes possible to prevent impurities such as boron from being implanted into the diffusion layer, which minimizes increase of the junction capacitance.

An advantage of the above-mentioned semiconductor integrated circuit device is that, due to the polycide layer formed on the substrate in contact with the diffusion layer, the resistance of the bit line is reduced to one tenth as low as in the known conventional structure, which makes it possible to increase the speed of the device.

Another advantage of the above-mentioned device is that, since the diffusion layer of the memory transistor area is formed by diffusing impurities of the polycide layer, a shallow diffusion layer can be formed, which makes it possible to reduce the transistor size.

Still another advantage of the above-mentioned device is that, since the polycide layer is interposed between the diffusion layer of the memory transistor area and the metal wirings thereof, aluminium spikes are avoided in spite of the fact that the diffusion layer is shallow.

Still another advantage of the above-mentioned device is that, since the polycide layer and the oxide film are disposed on the diffusion layer of the memory transistor, the ions implanted for the purpose of forming the ROM code are prevented from being implanted into the diffusion layer which makes it possible to avoid the increase of the junction capacitance.

Further objects and advantages of the present invention will be apparent from the following description of the preferred embodiments of the invention as illustrated in the accompanying drawings.

DESCRIPTION OF THE PREFERRED EMBODIMENTS

Figure 1:
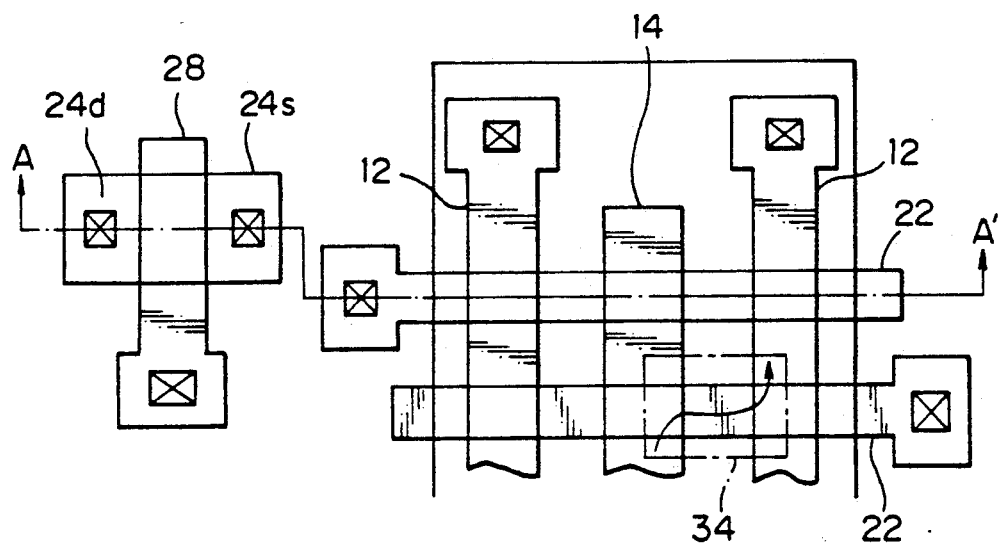
FIG. 1 is a plan view of a main portion of an embodiment of a semiconductor integrated circuit device in accordance with the present invention.
Figure 2:
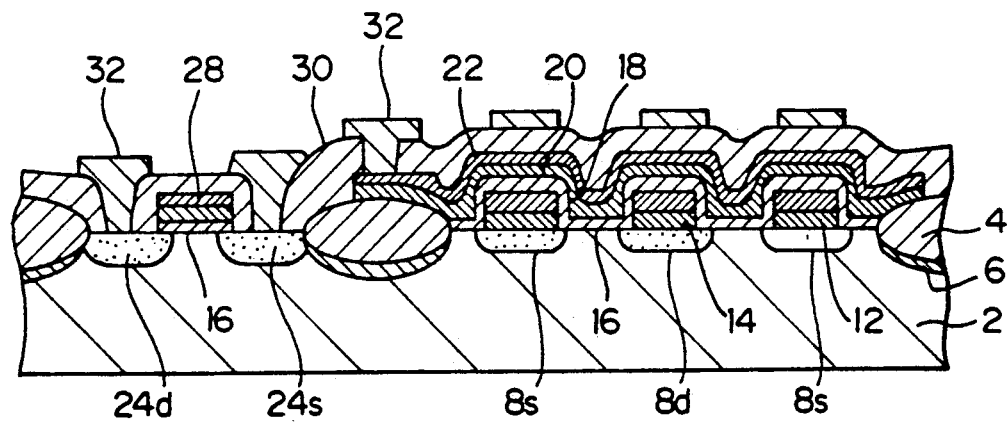
FIG. 2 is a sectional view of the device of FIG. 1 along the line A—A' in FIG. 1.

FIG. 1 illustrates a part of an embodiment of the present invention and FIG. 2 illustrates a section of the embodiment of FIG. 1 taken along the line A—A' of FIG. 1.

It is to be noted that metal wirings and the passivation film are omitted from the drawing of FIG. 1. Also, the passivation film is omitted from FIG. 2.

In each of FIGS. 1 and 2, the left side of the drawing represents a peripheral transistor area and the right side of the drawing represents a memory transistor area.

Numeral 2 designates a P-type silicon substrate on which are formed a patterned field oxide film 4 and a channel stopper layer 6 below each field oxide 4. The stacked layers composed of film 4 and layer 6 are disposed between the peripheral transistor and the memory transistor and between the peripheral transistors.

With regard to the memory transistor area, strip shaped N-type diffusion layers 8s and 8d which are parallel to each other constitute a source area and a drain area of a plurality of memory transistors, respectively. Each of the layers 8s and 8d is continuous for the plurality of transistors. A polycide layer 12 is formed on the diffusion layer 8s. Also, a polycide layer 14 is formed on the diffusion layer 8d. Each polycide layer is made as a multi-layer structure comprising a polysilicon layer, (an alloy layer made from silicon and a high melting point metal and formed on the polysilicon layer,) and a high melting point metal layer formed on the alloy layer.

The polysilicon layer of each of the layers 12 and 14 comprises phosphorus implanted therein. The layers 8s and 8d are formed by diffusing phosphorus from the polysilicon layer into the substrate 2. The layers 8s and 8d are shallow and about 0.1 to 0.3 μm deep. The arsenic remain in the polysilicon layer of each of the layers 12 and 14 to keep the resistance of the polysilicon layer low.

A gate oxide film 16 is formed on the substrate 2. A thick oxide film 18 is formed on each lateral side of the layer 12, 14. Also, a thick oxide film 20 is formed on the upper side of the layer 12, 14. The gate film 16 is about 100 to 500 Å thick. Each of the layers 18 and 20 is about 1000 to 5000 Å thick.

A second polycide layer is formed on the substrate 2 to constitute a gate electrode 22 which functions as a word line. The electrode 22 is arranged perpendicular to the longitudinal direction of each layer 8s, 8d. The electrode 22 is insulated from the substrate 2 and the layers 12, 14 by the oxide films 16, 18 and 20.

With regard to the peripheral transistor area, a source area 24s and a drain area 24d are formed from an N-type diffusion layer on the substrate 2. A gate electrode 28 made from a polycide layer is formed on the channel area between the diffusion layers 24s and 24d through a gate oxide film 16.

The substrate 2 and the electrodes 22 and 28 are covered by a layer insulation film 30 made from an oxide CVD film. The film 30 has contact holes through which a wiring contact metal 32 is connected to the electrode 22 or layers 24s, 24d.

In the memory transistor area, a portion 34 enclosed by a dash-dot line represents one memory transistor. A plurality of transistors are formed on the substrate. The threshold level of each transistor is set by implanting ions to determine the ROM code. When the threshold level is to be raised, boron may be implanted into the channel area of the memory transistor 34.

When the word line of electrode 22 is selected and a gate voltage is applied to the transistor 34, if the threshold level of the transistor 34 is low, current flows from the drain area (bit line) 8d to the source area 8s. On the other hand, if the threshold level is high, current does not flow. Therefore, data stored in the ROM is read out by a sense circuit connected to the bit line 14 composed of the polycide layer formed on the layer 8d.

An example of a method for producing the semiconductor integrated circuit device in accordance with the present invention is described hereinafter with reference to FIGS. 3a to 3f.

Figure 3A:
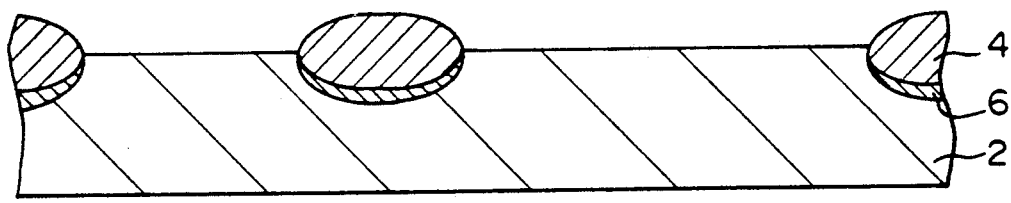
FIGS. 3a to 3f are sectional views of the device of an embodiment of the present invention for explaining an example of a process for producing the embodiment, illustrating the structures in different steps of the flow of the process in sequence.

FIG. 3a illustrates a first step (a), in which a channel stopper layer is formed by forming the channel stopper layer 6 and the field oxide film 4 in the P-type silicon substrate 2.

Figure 3B:
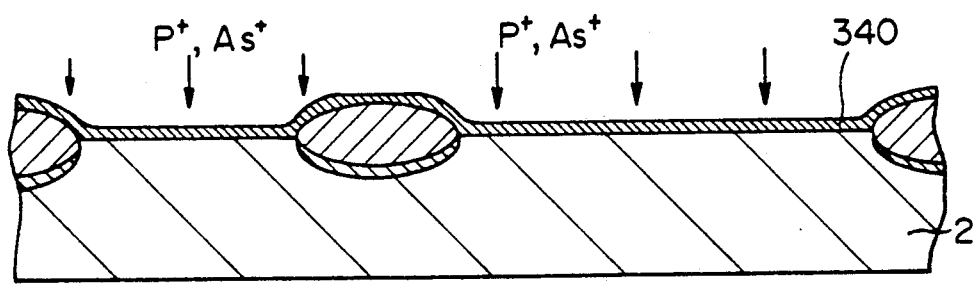

FIG. 3b illustrates a second step (b), in which a polysilicon layer 340 is deposited on the substrate 2 and the film 4; 340 is to 0.1 to 0.5 μm thick. Phosphorus and arsenic are implanted into the layer 340. The density of each implanted material is about $10^{17}$ to $10^{21}$ ions/cm$^3$. The implantation process is carried out at the low energy of about 10 to 50 KeV so that the phosphorus and the arsenic are not implanted into the substrate 2 (i.e., the implanted ious do not pass through the layer 340).

Figure 3C:
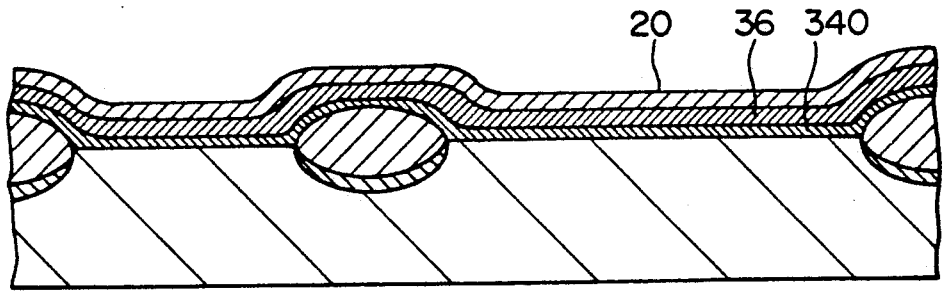

FIG. 3c illustrates a third step (c), in which a high melting point layer 36 of a material such as WSi$_2$ is deposited on the layer 340; layer 36 is about 0.1 to 0.5 μm thick. After that, an oxide film 20 is deposited on the layer 36; film 20 is about 0.1 to 0.5 μm thick.

Figure 3D:
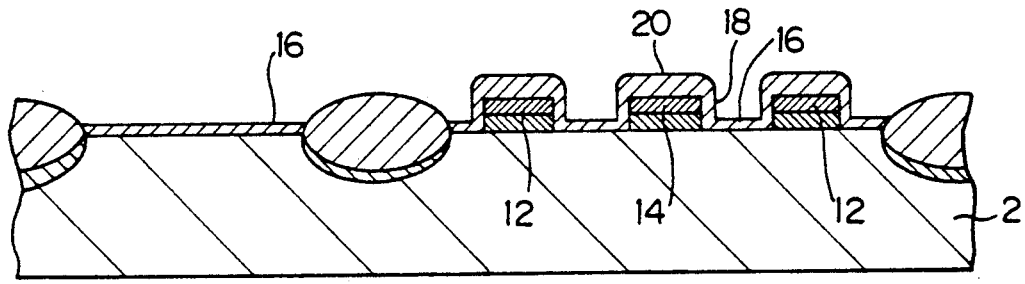

FIG. 3d illustrates a fourth step (d), in which the film 20, and the layers 36 and 340 are patterned by a photolithographic method and etching method so that polycide layers 12, 14 remain on the regions where diffusion layers are to be formed in the memory transistor area.

After that, an oxidation process is conducted to form an oxide film 16 and an oxide film 18 on the substrate 2 and each of the lateral sides of each layer 12, 14, respectively. The film 18 is thicker than the film 16 due to the increased oxidation effect of the polysilicon layer.

A sacrificial oxidation process may be conducted to restore the damaged surface of the substrate 2 impaired in the etching process. In this case, the sacrificial oxide film formed on the substrate surface is removed first. After that, the film 16 is formed on the substrate 2.

Figure 3E:
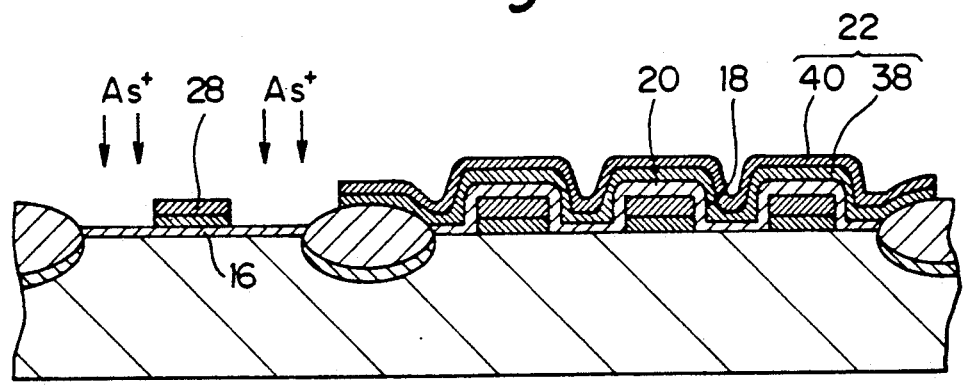

FIG. 3e illustrates a fifth step (e), in which a polysilicon layer 38 is deposited on the films 16, 18 and 20. Phosphorus is implanted into the layer 38. After that, a high melting point layer 40 of a material such as WSi$_2$ is deposited on the layer 38 by a sputtering method. The layers 40 and 38 are patterned to form the gate electrode 28 of the peripheral transistor and the word line gate electrode 22 of the memory transistor by a photolithographical process and an etching process. In the memory transistor area, the first layer 12, 14 and the second layer 22 are insulated from each other by the films 18 and 20.

Arsenic and phosphorus are implanted into the peripheral transistor area.

Figure 3F:
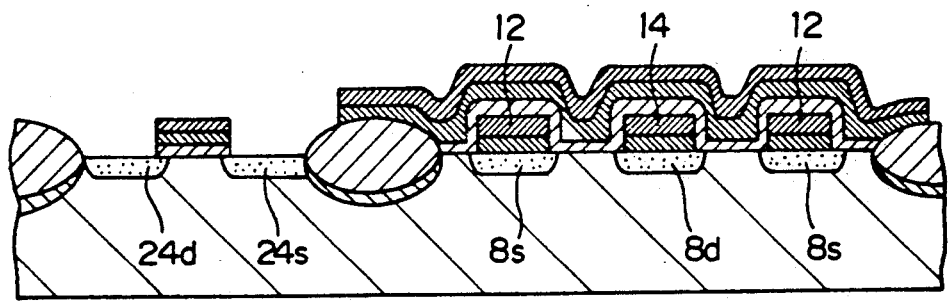

FIG. 3f illustrates a sixth step (f) in which the impurities implanted in the peripheral transistor are subjected to a heat treatment to form the source layer 24s and the drain layer 24d.

The phosphorus ions implanted in the polysilicon layers 12, 14 in the memory transistor area are diffused into the substrate 2 to form thin diffused layers 8s and 8d. In this diffusing process, the arsenic ions implanted in the polysilicon layer of each layer 12, 14 remain there due to to the diffusion constant of the layer.

After that, a layer insulation film is formed over the layer stacked substrate surface. Then, contact holes are formed in the insulation film at predetermined positions. After that, wiring metal is arranged in each contact hole to make the structure as illustrated in FIG. 2. Also, a passivation film is formed on the structure.

It is to be noted that the ion implantation used for determining the ROM code takes place after the second polycide layer is formed.

Many widely different embodiments of the present invention may be constructed without departing from the spirit and scope of the present invention. It should be understood that the present invention is not limited to the specific embodiments described in the specification, except as defined in the appended claims.

What is claimed is:

1. An integrated circuit memory device having a plurality of MOS transistors for storing respective data bits, said plurality of MOS transistors arranged in matrix having at least two ranks and two files, comprising:
   a substrate;
   a first continuous and elongated shallow diffusion layer formed in said substrate to constitute source areas for MOS transistors of a first file;
   a second continuous and elongated shallow diffusion layer formed in said substrate in parallel with said first diffusion layer to constitute source areas for MOS transistors of a second file;
   a third continuous and elongated shallow diffusion layer formed in said substrate in parallel with and between said first and said second diffusion layers to constitute drain areas for MOS transistors of said first and second files;
   a set of first elongated polycide layers, each of said first polycide layers formed on a respective one of said first, second and third diffusion layers in contact therewith to reduce the resistance of said respective one of said elongated diffusion layers;
   a set of second elongated polycide layers formed over said first polycide layers and traversing said first polycide layers in a direction perpendicular to the length of said first, second and third elongated diffusion layers, each of said second polycide layers constituting a gate electrode for MOS transistors of a respective rank; and
   dielectric layers interposed between said first and second polycide layers.

2. A memory device according to claim 1, wherein each of said first polycide layers comprises a polysilicon layer formed on said substrate and a layer of silicide formed on said polysilicon layer, wherein said silicide is a compound of silicon and refractory metal.

3. A memory device according to claim 2, wherein said polysilicon layer is doped with at least one of phosphorus and arsenic.

4. A memory device according to claim 1, wherein each transistor of said first file is defined at an area spanning said parallel first and third diffusion layers and each transistor of said second file is defined at an area spanning said parallel second and third diffusion layers.

* * * * *